United States Patent [19]

Stueck

[11] Patent Number: 4,694,195
[45] Date of Patent: Sep. 15, 1987

[54] RATIO ANALYZER

[75] Inventor: Troy L. Stueck, Baltimore, Md.

[73] Assignee: The United States of America as represented by the Secretary of the Air Force, Washington, D.C.

[21] Appl. No.: 493,593

[22] Filed: Oct. 6, 1965

[51] Int. Cl.$^4$ .......................... H03K 5/26; H04L 15/24
[52] U.S. Cl. ...................................... 307/234; 375/94; 328/161; 328/112; 307/518; 307/228
[58] Field of Search ............... 340/178, 825.63, 825.64, 340/825.57; 178/69, 118; 324/68, 68 A; 328/109, 110, 112, 143, 135, 145, 147, 157, 161, 111, 116, 133; 307/234, 518, 228; 375/22, 94

[56] References Cited

U.S. PATENT DOCUMENTS

| | | | |
|---|---|---|---|
| 2,996,665 | 8/1961 | Polen | 328/109 |
| 3,205,348 | 9/1965 | Kleinberg | 328/161 |
| 3,255,417 | 6/1966 | Gottlieb | 328/145 |

Primary Examiner—T. H. Tubbesing
Assistant Examiner—Gilberto Barrón, Jr.
Attorney, Agent, or Firm—Thomas L. Kundert; Donald J. Singer; Joseph E. Rusz

[57] ABSTRACT

A ratio analyzer employing two time-base generators which are used to convert time intervals to analog voltages. The outputs of the two time-base generators are sampled and the amplitude of one pulse is divided into the amplitude of the second pulse which gives an output voltage representation of the ratio of the two original pulse widths. The output voltage representation is indicative of the type of input signal present and thus may be used to analyze the input signal.

3 Claims, 1 Drawing Figure

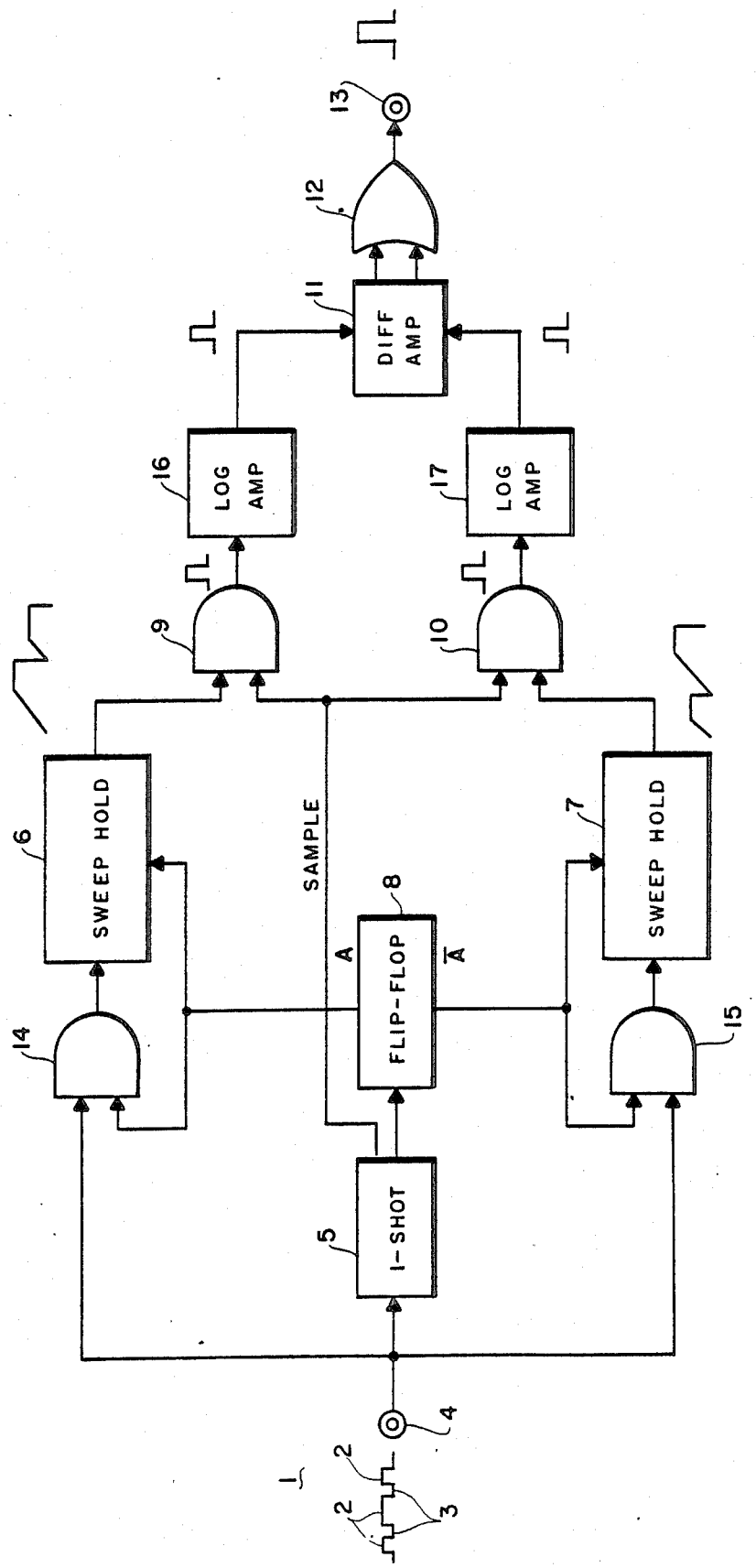

RATIO ANALYZER

RIGHTS OF THE GOVERNMENT

The invention described herein may be manufactured and used by or for the Government of the United States for all governmental purposes without the payment of any royalty.

BACKGROUND OF THE INVENTION

This invention relates to a system for detecting various types of pulsed signals, such as teletype, automatic Morse, manual Morse, and similar types of pulsed signals that are used in communicating. This detecting or recognition of a signal type is accomplished by determining the ratio of consecutive signal element widths and providing an output pulse having an amplitude that is a function of this ratio.

Ratio analysis is a useful and convenient method of analysis because it essentially normalizes the speed of transmission. In signal recognition once the rate has been determined, it is desirable to make the rest of the system as independent of rate as possible. Ratio analysis accomplishes this by examining the successive ratios of the signal element intervals. Mark-to-mark or space-to-space ratios can be used. The ratio distribution for machine Morse, manual Morse, teleprinter, and other possible signals in the expected environment are quite distinct and separable.

For Morse signals, almost every ratio falls into one of three discrete classes: either a 1:1, a 1:3, or a 3:1 ratio of pulse widths are present over 95 percent of the time. For teleprinter and all other signals in the environment, the frequency of occurrence of these ratios is quite low. Of course, a tolerance around these discrete ratios is necessary to account for possible bias on automatic Morse transmissions and the erratic distributions of manual Morse transmission. Besides separating all Morse signals from other transmissions, the ratio analyzer herein set forth will provide an output signal for distinguishing automatic Morse from manual Morse by the indication of the actual tightness of the ratio distribution.

SUMMARY OF THE INVENTION

It is an object of the present invention to provide a system for indicating a particular type of pulsed communication transmission.

It is another object of the present invention to provide a system having an output signal that is a function of the ratio of the durations of the characteristics of an input signal.

It is another object of the present invention to provide a system that will provide an output voltage whose amplitude is a function of the ratio of successive intervals of time.

These and other features and objects of this invention will become apparent by reference to the following description and the accompanying drawing which illustrates the invention.

The device employs two time-base generators which are used to convert time intervals to analog voltages. The outputs of the two time-base generators are sampled and the amplitude of one pulse is divided into the amplitude of the second pulse which gives an output voltage representation of the ratio of the two original pulse widths. This output pulse is indicative of the type of input signal present and thus may be used to analyze the input signal.

BRIEF DESCRIPTION OF THE DRAWING

The single FIGURE of drawing is a block diagram of a ratio analyzer circuit according to one embodiment of the present invention.

DETAILED DESCRIPTION

Referring to the FIGURE which is a block diagram of an embodiment of the invention; the signal 1 of unknown type consisting of mark 2 and space 3 intervals is to be analyzed as to successive mark and space widths, i.e., mark-to-mark or space-to-space intervals. The signal enters the device at the input terminal 4.

The one-shot switching circuit 5 which may be a monostable multivibrator, has two functions. One function is to sample the output of the sweep hold circuits 6 and 7 which comprise saw-tooth time base generators which produce voltages whose amplitudes are proportional to the mark and space widths of the input signal and which also store or maintain the amplitude of voltage that the sweep has risen to until after the sampling is made. Sweep hold circuits are also known as sweep-store, sweep-pause and sweep-coast circuits. They are in quite common use in radar range tracking circuits and in cathode voltage display circuits. A variety of well-known voltage sweep generating circuits, wherein a sawtooth voltage rise is initiated by a first voltage step or pulse and the rise terminated by a second voltage step or pulse, cooperating with a diode-capacitor voltage storage circuit may be used to establish a voltage that is representative of mark-space width, or time interval. Multivibrator and Miller sweep generator circuits have proven very satisfactory circuits for generating this voltage. A simultaneous sampling of the magnitude of these stored, or held, voltages is accomplished by the use of AND gates 9 and 10. Each of these gates thus passes the stored voltage from their respective sweep hold circuits 6 and 7 to their respective logarithmic amplifiers 16 and 17 when actuated by the "sample" signal from the one-shot multivibrator 5. Since the magnitudes of the stored voltage are passed by these gates only when the sampling signal is present in the gate, it is commonly said that a sampling of the voltages are taken. The other function of the one-shot switching circuit is to delay the trigger pulse to the flip-flop 8 until after the sample is made. The flip-flop may be a conventional bistable multivibrator.

The division of one pulse amplitude by the other is accomplished by taking the difference of the logarithms of the two pulses which yields an output pulse whose amplitude is the logarithm of the ratio. Thus, the amplitude of each output pulse from the difference amplifier 11 represents the logarithm of the input ratio of consecutive mark-space and space-mark ratios. A logarithmic amplifier is used for three reasons. First, the ratio distribution tolerance limits must be absolute limits, and represent a certain percentage deviation about a prescribed means. The measure of the tolerance limit must remain the same regardless of the input speed. If the logarithm were not taken, this would not be the case. The tolerance limits would be very small for a high speed input and quite large for a slow speed signal. The percentage deviation would remain the same, but the absolute limit would be a function of rate. By taking the logarithm of the representative amplitude voltage, the ratio distribution limits and corresponding thresholds are made independent of rate. Secondly, a logarithmic amplifier acts as a compressor and this enhances the output dynamic range, and finally the use of logarithms greatly simplifies the formation of the ratios. Division, other than logarithmically, is a difficult feat to perform electronically and it is usually not very accurate. However, by using this logarithmic method the difference of the outputs of the two logarithmic amplifiers is taken, and the result is the logarithm of the ratio of the input amplitudes. Thus, the output pulse from the difference amplifier 11 is the logarithm of the difference in the signal amplitudes present at the input to the logarithmic amplifiers 16 and 17 and hence is the logarithm of the ratio of successive mark intervals or space intervals in the input signal 1. Even though this difference signal is proportional to the logarithm of the ratio of the signal time intervals it effectively identifies the type of input signal. An expander, or antilog amplifier may be employed, if found desirable, to convert this log signal to the true ratio signal if it is required by further utilization equipment.

Since the output of the difference amplifier 11 consists of two equal pulses (positive and negative), the OR gate 12 is used to detect just the positive pulses to facilitate and simplify the correlation of the output. In other words, the OR gate 12 always provides an output signal at the output terminal 13 for a ratio greater than one-to-one passing only positive difference values. By looking for a specific voltage out of the device, the occurrence of specific ratios can be correlated against the occurrence of all the other ratios. For example, the occurrence of 1 to 1.5 is frequent in teletype whereas in Morse 1 to 3 is frequent. The reference library on the output of the device can be made as small or as large as desired by detecting the required number of ratios for the desired codes.

The AND gates 14 and 15 correctly time the sampling of the input signal to the sweep hold circuits.

How this is done may be understood by considering the sequences of the actions taking place when a signal 1 enters the device. A signal element comprises a mark (shown as a positive pulse) and a space, the space being the next consecutive interval in which no signal is present preceding the following pulse. The next consecutive signal element is that following pulse and its following space. It is the time ratio of these two signal elements that this invention determines. The leading edge of the first pulse of the first signal element triggers the monostable (or one-shot) multivibrator 5. As the one-shot multivibrator is triggered only by positive going pulses it may readily be seen that it fires only at the start of each signal element. When the one-shot multivibrator fires it produces a short pulse having a leading edge or rising voltage step and a trailing edge or falling voltage step. The bistable multivibrator (or flip-flop) 8 is in one of its stable states. It has two stable states, A and $\bar{A}$. If in A state gate 14 is open (ready for conduction of a signal from input 4), and gate 15 is closed (nonconductive) to a signal from input 4; likewise when the bistable multivibrator is in state $\bar{A}$ gate 14 is closed and gate 15 is open. Assuming for explanatory purposes that flip-flop 8 is originally in state A, thus the leading edge of the first signal element causes the one-shot multivibrator 5 to fire producing a pulse, the trailing edge of which triggers the flip-flop 8 causing it to change from stable state A to stable state $\bar{A}$. The leading edge of the same pulse from the one-shot multivibrator opens the sampling gates 9 and 10 permitting any voltages stored in the sweep hold circuits to pass to the logarithmic amplifiers. (Of course, on the initial first two signal elements, the system has not had the opportunity to store comparison voltages and no usable output is obtained.)

The leading edge of the first signal element thus fires the one-shot multivibrator 5 which triggers the flip-flop 8. The flip-flop then changes to state A and opens gate 15 permitting the first signal element to enter the sweep hold circuit and initiate in the sweep hold circuit 7 a voltage rise which continues for the duration of the signal element. At the occurrence of the leading edge of the second signal element, one-shot multivibrator 5 fires again, triggering the flip-flop 8 which changes from state $\bar{A}$ to state A closing gate 15 and opening gate 14. Sweep hold circuit 7 stores (maintains) the voltage to which it had risen during the duration of the first signal element. The second signal element passes through gate 14 and initiates the rising voltage in sweep hold circuit 6. (Again at the onset of the second signal element gates 9 and 10 were open, but since no previous voltage had been stored in sweep hold circuit 6, no usable output was obtained.) Sweep hold circuit 6 develops a voltage proportional to the duration of the second signal element and at the cessation of the second signal element, (the onset of the third element), gate 14 is shut off, the rising voltage sweep of the sweep hold circuit stopped, and that voltage stored.

It is now apparent that at the onset of the third signal element, a voltage proportional to the duration of the first signal element is stored in sweep hold 7 and a voltage proportional to the second signal element is stored in sweep hold 6. The onset of the third signal element fires the one-shot multivibrator 5 generating a pulse, the leading edge of which opens gates 9 and 10 simultaneously, and a sampling of the stored voltages are passed to their respective logarithmic amplifiers. The trailing edge of this pulse from the one-shot multivibrator triggers the flip-flop 8, which changes states. Thus the flip-flop closes gate 14, opens gate 15, terminates (reduces to zero) the voltage stored in sweep hold 7, and permits sweep hold 7 to start its rising sweep for the third signal element. The small delay time between the rise and the fall in the pulse from the one-shot multivibrator thus provides for the sampling voltages to be obtained (passed to the logarithmic amplifiers) from the sweep holds before a sweep hold starts on its next rising sweep. It is preferable that the pulse length of the one-shot multivibrator be approximately one-tenth, or less, than a signal element length. This process continues as long as signal is entering the system at input 4, and the information at output 13 is thus a train of pulses representing the ratio of the time durations of consecutive signal elements.

It is to be understood that proper voltage and impedance matching means will be employed throughout the system and that the time constants of the circuits throughout the system will be made compatible with the time rates of the input signals that it is desired to encompass.

What is claimed is:

1. A ratio analyzer for providing an output voltage that is a function of the ratio of successive mark-space intervals of a pulsed communication input signal, the said analyzer comprising: a first means including a monostable multivibrator and a bistable multivibrator for providing an output corresponding to the mark-to-mark intervals of the said input signal and providing a sampling signal output; a second means including a sweep time base generator and voltage storage, responsive to the said first means and the said input signal, providing an output voltage proportional to said mark-space interval of said input signal; a third means including an AND gate responsive to the said sampling signal of said first means and the said output voltage of said second means, providing an output voltage proportional to the mark-space interval of said input signal; a fourth means including a logarithmic amplifier responsive to said third means and providing an output voltage proportional to the logarithm of the said output voltage of said third means; and means including a difference amplifier responsive to the output voltage of said fourth means for providing an output signal that is proportional to the difference in the logarithms of said successive mark-space interval of the said input signal, said difference signal being a function of the ratio of the said intervals.

2. A ratio analyzer for providing a voltage that is the logarithm of the ratio of two successive signal elements of a source of pulsed communication signals comprising: a one-shot monostable multivibrator responsive only to the onset of said signal elements for providing a pulse with a leading edge and a trailing edge and a pulse duration approximately 1/10 or less, the duration of a signal element; a flip-flop bistable multivibrator having two stable states cooperating with the said one-shot multivibrator by switching states in response to the trailing edge of the said pulse of the one-shot multivibrator; a first AND gate responsive to the said source of communication signals and the said flip-flop for passing the communication signal when the said flip-flop is in one of its stable state; a second AND gate responsive to the said source of communication signals and the said flip-flop for passing the communication signal when the said flip-flop is in the other of its stable states; a first sweep hold cooperating with the said flip-flop and the said first AND gate for providing and holding a first voltage responsive to the time duration of the first signal element of the said two successive signal elements; a second sweep hold cooperating with the said flip-flop and the said second AND gate for providing and holding a second voltage responsive to the time duration of the second signal element of the said two successive signal elements; a third AND gate cooperating with the said first sweep hold and the said one-shot multivibrator for passing the said first held voltage from the said first sweep hold for the said pulse duration of the said one-shot multivibrator; a fourth AND gate cooperating with the said second sweep hold and the said one-shot multivibrator for passing the said second held voltage for the said pulse duration of the said one-shot multivibrator; a first logarithmic amplifier cooperating with the said third AND gate for providing an output proportional to the logarithm of the said passed first hold voltage; a second logarithmic amplifier cooperating with the said fourth AND gate for providing an output proportional to the logarithm of the said passed second held voltage; a difference amplifier cooperating with the said first logarithm amplifier and the said second logarithm amplifier for providing an output responsive to the difference of the said outputs of the said first and second logarithm amplifiers; and an OR gate cooperating with the said difference amplifier for providing an output of only the positive differences of the said outputs of the difference amplifier.

3. An electrical system for determining the ratio of a first time interval and a second time interval comprising: a first time base generator means for providing an output voltage having an amplitude proportional to said first time interval; a second time base generator means for providing an output voltage having an amplitude proportional to the said second time interval; a first logarithmic amplification means for providing a voltage having an amplitude proportional to the logarithm of the said output voltage of the first time base generating means; a second logarithmic amplification means for providing a voltage having an amplitude proportional to the logarithm of the said output of the second time base generating means; a difference amplifier means for providing an output signal having an amplitude proportional to both the positive and negative differences in the amplitudes of the said output voltages from the said first and said second logarithm amplifier means; and an OR gate means responsive to the positive and negative outputs of the said difference amplifier means for detecting only the positive output of the said difference amplifier and providing a positive output voltage that is a function of the said first and said second time intervals taken in such order that the said ratio is greater than unity.

* * * * *